United States Patent
Tan et al.

(10) Patent No.: US 12,215,021 B1
(45) Date of Patent: Feb. 4, 2025

(54) CAPACITIVE SENSING CIRCUIT AND CAPACITIVE SENSING METHOD

(71) Applicant: AAC Technologies Pte. Ltd., Singapore (SG)

(72) Inventors: Siewseong Tan, Singapore (SG); Awinash Anand, Katmandu (NP); Tiongkee Chua, Singapore (SG)

(73) Assignee: AAC Technologies Pte. Ltd., Singapore (SG)

( * ) Notice: Subject to any disclaimer, the term of this patent is extended or adjusted under 35 U.S.C. 154(b) by 34 days.

(21) Appl. No.: 18/363,706

(22) Filed: Aug. 1, 2023

(51) Int. Cl.
*B81B 7/00* (2006.01)
*H03M 3/00* (2006.01)

(52) U.S. Cl.
CPC .............. *B81B 7/008* (2013.01); *H03M 3/39* (2013.01)

(58) Field of Classification Search
CPC ............ B81B 7/008; H03M 3/30; H03M 3/39
USPC ......................................................... 327/100
See application file for complete search history.

(56) References Cited

U.S. PATENT DOCUMENTS

| | | | |
|---|---|---|---|
| 11,683,624 B1* | 6/2023 | Aschieri | H03K 5/24 381/369 |
| 2014/0253219 A1* | 9/2014 | Caffee | H03L 7/1976 327/516 |
| 2015/0110295 A1* | 4/2015 | Jenkner | H04R 3/00 381/114 |
| 2017/0223450 A1* | 8/2017 | Paton Alvarez | H04R 3/00 |
| 2023/0112042 A1* | 4/2023 | Toft | H04R 1/04 381/93 |
| 2023/0113827 A1* | 4/2023 | Toft | H02N 2/0075 310/317 |

\* cited by examiner

*Primary Examiner* — William Hernandez
(74) *Attorney, Agent, or Firm* — W&G Law Group

(57) ABSTRACT

Provided is a capacitive sensing circuit and capacitive sensing method. The circuit includes a charge pump, a micro-electro-mechanical system (MEMS) chip, an analog signal modulator configured to perform analog signal modulation to an output signal of the MEMS chip and an output signal of the analog signal modulator, and a digital signal modulator configured to perform digital signal modulation to the output signal of the analog signal modulator, and output a modulated signal by a digital interface. By directly using the input signal of the MEMS chip and the output signal of the analog signal modulator as the input signal for analog modulation, the harmonic distortion is reduced.

10 Claims, 5 Drawing Sheets

CAPACITIVE SENSING CIRCUIT AND CAPACITIVE SENSING METHOD

TECHNICAL FIELD

The present disclosure relates to the technical field of signal processing and, in particular, to a capacitive sensing circuit and a capacitive sensing method.

BACKGROUND

Micro-electro-mechanical systems (MEMS) chips can convert external physical signals such as sound into electrical signals. In some situations, it is necessary to process electrical signals, to be specific, electrical signals can be subjected to analog modulation and then digital modulation.

During analog modulation, an analog front end (AFE) module performs low-noise power amplification and active bias, and when an amplitude of an input acoustic signal is excessively large, the AFE module will be saturated and thus cause harmonic distortion.

SUMMARY

Embodiments of the present disclosure provide a capacitive sensing circuit and capacitive sensing method, which can reduce harmonic distortion that occurs during MEMS chip processing.

An embodiment of the present disclosure provides a capacitive sensing circuit, including a charge pump, a micro-electro-mechanical system (MEMS) chip, an analog signal modulator configured to perform analog signal modulation to an output signal of the MEMS chip and an output signal of the analog signal modulator, and a digital signal modulator configured to perform digital signal modulation to the output signal of the analog signal modulator, and output a modulated signal by a digital interface.

As an improvement, the capacitive sensing circuit further includes a power supply circuit which includes a filter, and a voltage stabilizer connected to each other. The power supply circuit is configured to supply power to the MEMS chip, the analog signal modulator, and the digital signal modulator.

As an improvement, the analog signal modulator uses an input signal of the MEMS chip and an output signal of the digital signal modulator as feedback signals to perform differentiate operation to construct a closed loop.

As an improvement, the analog signal modulator is a Δ-Σ modulator.

As an improvement, the digital signal modulator is a Δ-Σ digital modulator.

The present disclosure has the following beneficial effects: the harmonic distortion is effectively reduced by directly using the input signal of the MEMS chip and the output signal of the analog signal modulator as the input signal for analog modulation.

In the second aspect, the present disclosure provides a capacitive sensing method, applied to a circuit including a charge pump, a MEMS chip, an analog signal modulator, and a digital signal modulator. The method includes: performing, by the analog signal modulator, analog signal modulation to an output signal of the MEMS chip and an output signal of the analog signal modulator, and performing, by the digital signal modulator, digital signal modulation to the output signal of the analog signal modulator, and outputting a modulated signal by a digital interface.

As an improvement, the method further includes supplying power, by a power supply circuit including a filter and a voltage stabilizer connected to each other, to the MEMS chip, the analog signal modulator, and the digital signal modulator.

As an improvement, the analog signal modulator uses an input signal of the MEMS chip and an output signal of the digital signal modulator as feedback signals to perform differentiate operation to construct a closed loop.

As an improvement, the analog signal modulator is a Δ-Σ modulator.

As an improvement, the digital signal modulator is a Δ-Σ digital modulator.

It should be understood that the second aspect of the embodiments of the present disclosure is consistent with the technical solutions of the first aspect of the embodiments of the present disclosure, and the beneficial effects obtained by the various aspects and corresponding feasible implementations are similar, so details are not repeated herein.

BRIEF DESCRIPTION OF DRAWINGS

In order to better illustrate the technical solutions of the embodiments of the present disclosure, the accompanying drawings used in the embodiments will be introduced as below. It is appreciated that, the accompanying drawings in the following description are only some examples of the embodiments of the present disclosure. For those skilled in the art, other drawings can also be obtained based on these drawings without creative effort.

DESCRIPTION OF EMBODIMENTS

In order to better understand the technical solutions of the embodiments of the present disclosure, the embodiments of the present disclosure will be described in detail below in conjunction with the accompanying drawings.

It should be made clear that the described embodiments are only some of the embodiments of the present disclosure, rather than all of them. Based on the embodiments in the present disclosure, all other embodiments obtained by those skilled in the art without creative efforts belong to the protection scope of the embodiments of the present disclosure.

Terms used in the embodiments of the present disclosure are only for the purpose of describing specific embodiments, and are not intended to limit the embodiments of the present disclosure. As used in the embodiments of the present disclosure and the appended claims, the singular forms "a/an", "said" and "the" are also intended to include the plural forms unless otherwise clearly indicated in the context.

Figure 1:
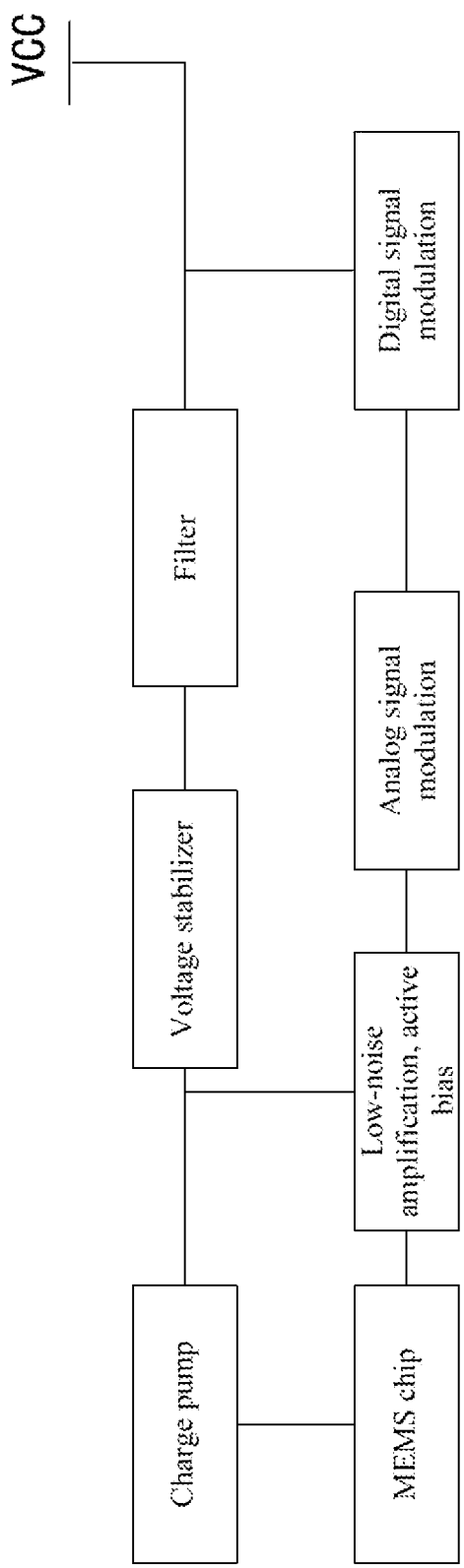
FIG. 1 is a structural diagram of a capacitive sensing circuit of the related art.

Please refer to FIG. 1, in the related art, the working principle of the capacitive sensing circuit is as follows:

An output of the MEMS chip is input to the AFE module for low-noise power amplification and active bias, and then after analog modulation and digital modulation, an output signal is generated by using a digital interface sensor. When the input acoustic signal has an excessive dB value, an amplitude of the output signal of the AFE module corresponding to the acoustic signal increases, and the AFE module may become saturated, resulting in harmonic distortion of the output.

In an embodiment, assuming that the full dB scale of the acoustic signal input is 131, the total harmonic distortion output by the AFE module is 7.5%, and after processing, the harmonic distortion rate is 7.8%.

To sum up, it is urgent to provide a method for reducing harmonic distortion in the related art.

Figure 2:
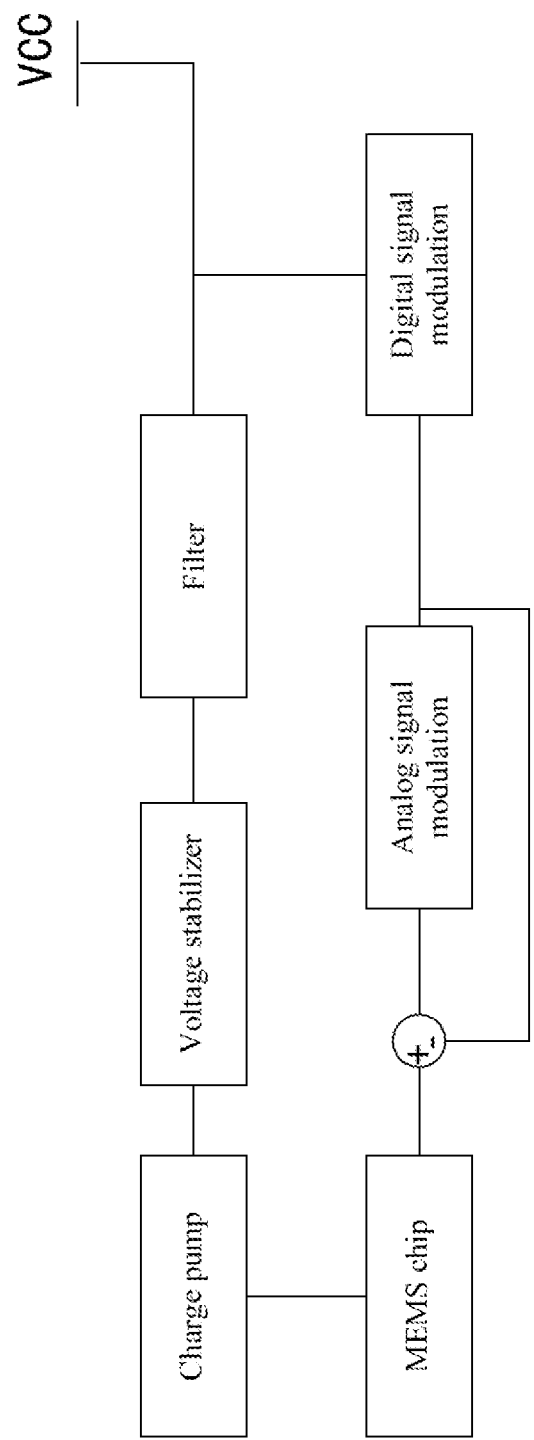
FIG. 2 is a structural diagram of a capacitive sensing circuit according to an embodiment of the present disclosure.

In view of the technical problems in the related art, the present disclosure provides technical solutions as follows:

Please refer to FIG. 2, the present disclosure provides a capacitive sensing circuit, including a charge pump, a MEMS chip, an analog signal modulator, and a digital signal modulator.

The analog signal modulator is configured to perform analog signal modulation to the output signal of the MEMS chip and the output signal of the analog signal modulator.

The digital signal modulator is configured to perform digital signal modulation to the output signal of the analog signal modulator, and output a modulated signal by a digital interface.

The analog signal modulator uses the input signal of the MEMS chip and the output signal of the digital signal modulator as feedback signals to perform differentiate operation, to construct a closed loop.

That is, the signal output by the MEMS chip is directly subtracted by the output of the analog signal modulator. Please refer to FIG. 3, in which 1 represents the analog signal feedback waveform, and 2 represents the acoustic signal waveform, and 3 represents the waveform after differentiate operation of the acoustic signal and the analog signal. The acoustic signal will be subtracted by its' feedback signal, thus the signal swing is limited, thereby improving the distortion.

In an embodiment, the analog signal modulator is a $\Delta$-$\Sigma$ modulator.

In an embodiment, the digital signal modulator is a $\Delta$-$\Sigma$ digital modulator.

Figure 4:
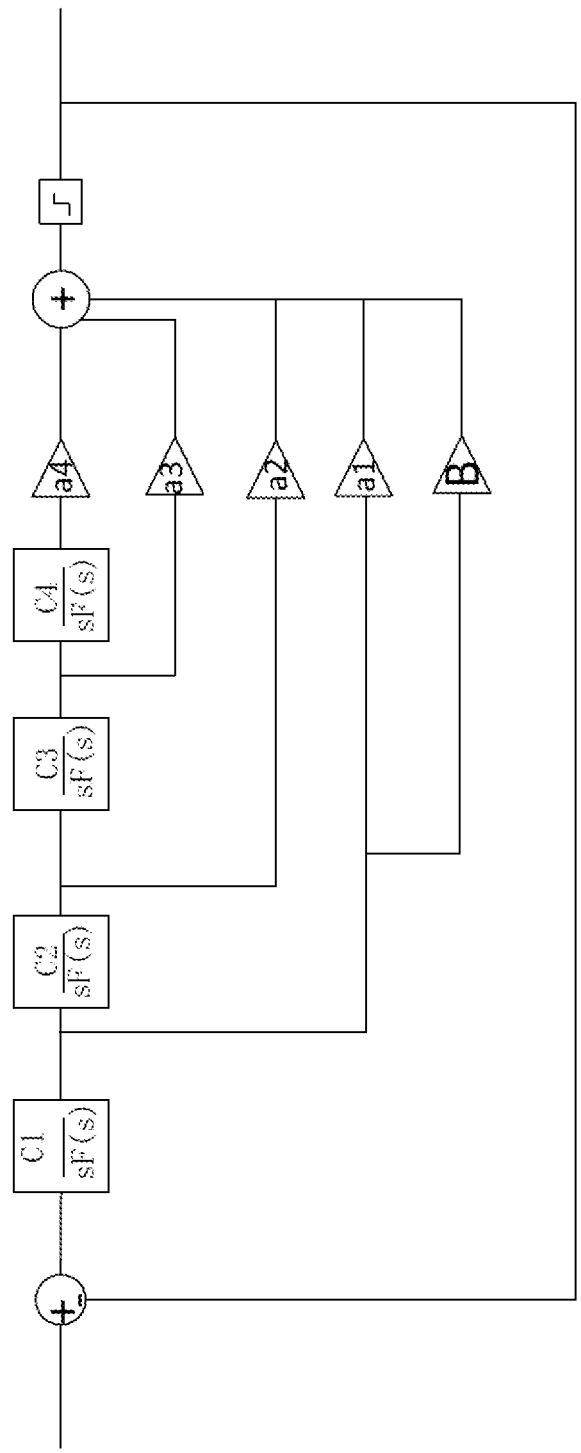
FIG. 4 is a structural diagram of a Δ-Σ modulator according to an embodiment of the present disclosure.

The structure of the $\Delta$-$\Sigma$ modulator used in present disclosure is shown in FIG. 4 below. Those skilled in the art can configure the relevant parameters of the $\Delta$-$\Sigma$ modulator to eliminate harmonic distortion.

In the present disclosure, in order to supply power to various components, the above-mentioned circuit also includes a power supply circuit, and the power supply circuit includes a filter and a voltage stabilizer that are connected to each other.

The power supply circuit is configured to supply power to the MEMS chip, the analog signal modulator, and the digital signal modulator.

The charge pump is configured to boost the output voltage of the voltage stabilizer, so as to supply power to the MEMS chip, and the output voltage of the voltage stabilizer supplies power to the analog signal modulator.

That is, components in the power supply circuit are configured to supply power to corresponding components in the circuit, which will not be described in detail.

Figure 5:
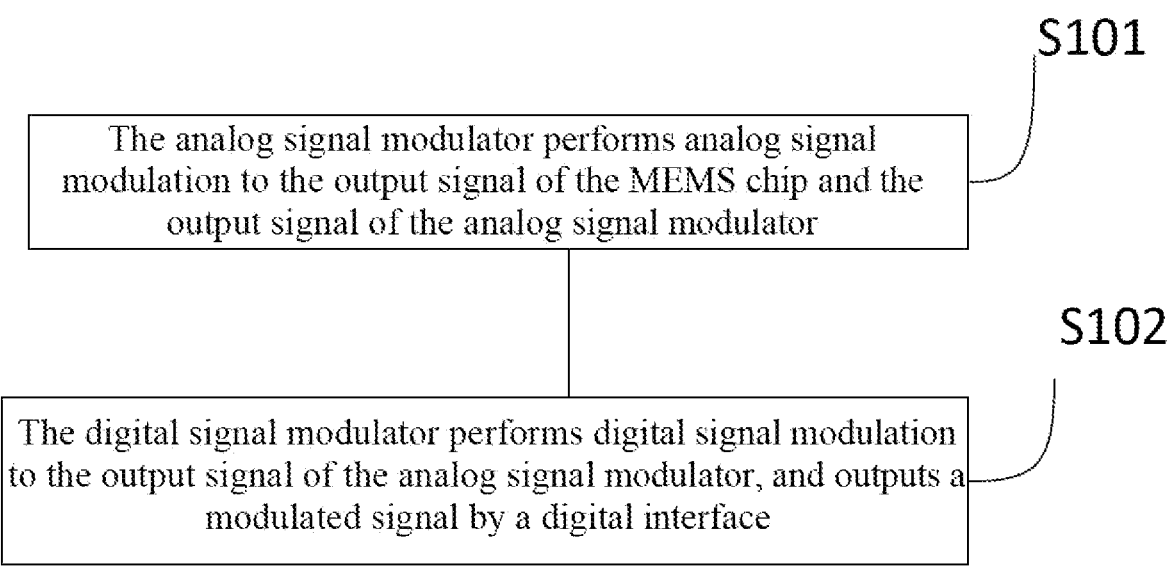
FIG. 5 is a flow diagram of a capacitive sensing method according to an embodiment of the present disclosure.

FIG. 5 is a flow diagram of a capacitive sensing method according to an embodiment of the present disclosure. The method is applied to a circuit including a charge pump, a MEMS chip, an analog signal modulator, and a digital signal modulator. The method includes the following steps:

S101: The analog signal modulator performs analog signal modulation to the output signal of the MEMS chip and the output signal of the analog signal modulator.

S102: The digital signal modulator performs digital signal modulation to the output signal of the analog signal modulator, and outputs a modulated signal by a digital interface.

In an embodiment, a power supply circuit is provided, and the power supply circuit includes a filter and a voltage stabilizer connected to each other.

The power supply circuit is configured to supply power to the MEMS chip, the analog signal modulator, and the digital signal modulator.

In an embodiment, the analog signal modulator uses the input signal of the MEMS chip and the output signal of the digital signal modulator as feedback signals to perform differentiate operation, to construct a closed loop.

In an embodiment, the analog signal modulator is a $\Delta$-$\Sigma$ modulator.

In an embodiment, the digital signal modulator is a $\Delta$-$\Sigma$ digital modulator.

Figure 3:
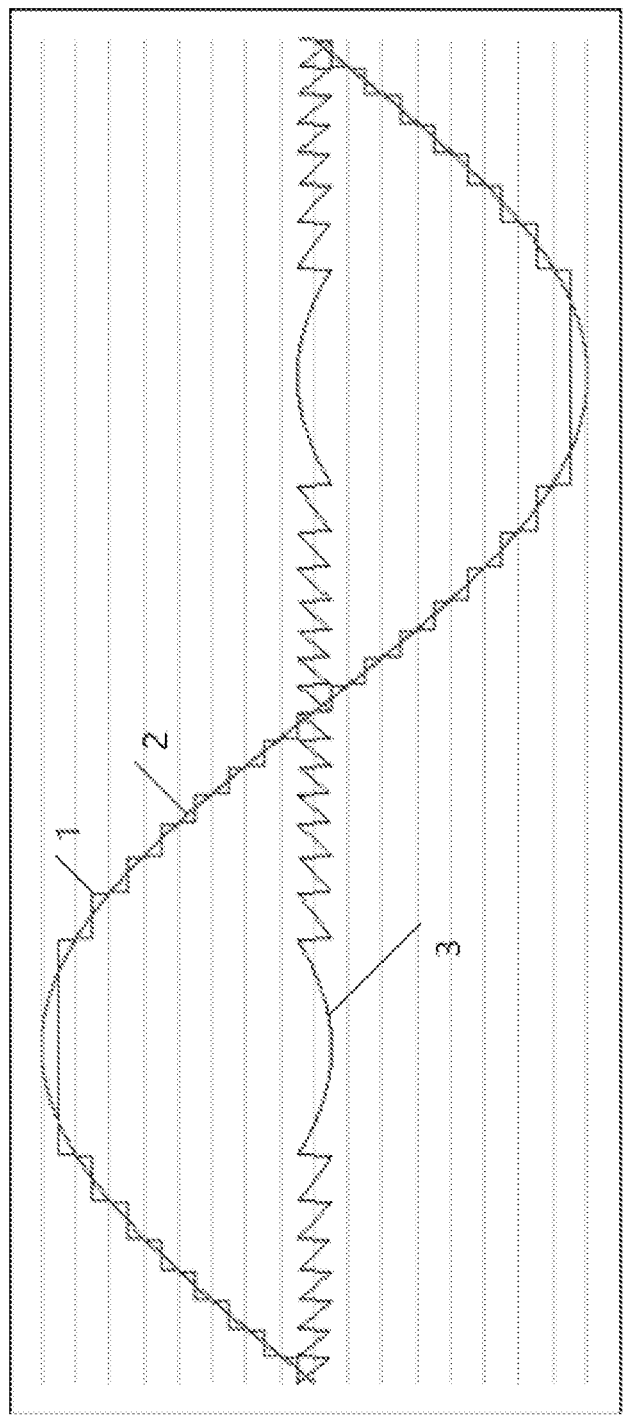
FIG. 3 is a waveform diagram of an acoustic signal and an analog signal after differentiate operation according to an embodiment of the present disclosure.

The principle and beneficial effects of the capacitive sensor sensing method according to the embodiments shown in FIG. 5 can be referred to the technical solutions of the method embodiments shown in FIG. 2 to FIG. 4.

The technical solutions provided in the present disclosure may bring the following beneficial effects: 1) the acoustic signal and the feedback signal of the analog signal modulator are subjected to differentiate operation to construct a closed loop, which reduces harmonic distortion; and 2) the AFE module is not required in present disclosure, which reduces the chip area.

In embodiments of the present disclosure, terms "one embodiment", "some embodiments", "example", "specific examples", or "some examples" mean that particular features, structures, materials, or characteristics are included in at least one embodiment or example of the present disclosure, and the illustrations of the above terms do not necessarily refer to the same embodiment or example. Moreover, the described specific features, structures, materials or characteristics may be combined in any suitable manner in any one or more embodiments or examples. Those skilled in the art may combine different embodiments or examples and features of different embodiments or examples described in the embodiments of the present disclosure as long as there is no contradiction therebetween.

The terms "first" and "second" are used for descriptive purposes only, and shall not be interpreted as indicating or implying relative importance or implicitly specifying the quantity of indicated technical features. Thus, the features defined by "first" and "second" may explicitly or implicitly include at least one of these features. In embodiments of the present disclosure, "plurality" means at least two, such as two, three, etc., unless otherwise defined.

Any process or method descriptions in flowcharts or otherwise described herein may be understood to represent a module, segment or portion of programming codes including one or more executable instructions for implementing custom logical functions or steps of a process, and the scope of preferred implementations of embodiments of the present disclosure includes additional implementations in which functions may be performed other than the order shown or discussed, which shall be understood by those skilled in the art.

The functional units in embodiments of the present disclosure may be integrated into one processing unit, or may exist separately, or two or more units may be integrated into one unit. The above-mentioned integrated units can be implemented in the form of hardware, or in the form of hardware plus software functional units.

The above descriptions are only preferred embodiments of the present disclosure, and are not intended to limit the embodiments of the present disclosure. All modifications, equivalent replacements, and changes may be made within the spirit and principles of the embodiments of the present disclosure.

What is claimed is:

1. A capacitive sensing circuit, comprising:
   a charge pump,
   a micro-electro-mechanical system (MEMS) chip,
   an analog signal modulator configured to perform analog signal modulation to an output signal of the MEMS chip and an output signal of the analog signal modulator, and
   a digital signal modulator configured to perform digital signal modulation to the output signal of the analog signal modulator, and output a modulated signal by a digital interface.

2. The circuit according to claim 1, further comprising:
   a power supply circuit comprising a filter and a voltage stabilizer connected to each other, and
   the power supply circuit is configured to supply power to the MEMS chip, the analog signal modulator, and the digital signal modulator.

3. The circuit according to claim 1, wherein the analog signal modulator uses an input signal of the MEMS chip and an output signal of the digital signal modulator as feedback signals to perform differentiate operation to construct a closed loop.

4. The circuit according to claim 3, wherein the analog signal modulator is a Δ-Σ modulator.

5. The circuit according to claim 3, wherein the digital signal modulator is a Δ-Σ digital modulator.

6. A capacitive sensing method, applied to a circuit comprising a charge pump, a MEMS chip, an analog signal modulator, and a digital signal modulator, wherein the method comprises:
   performing, by the analog signal modulator, analog signal modulation to an output signal of the MEMS chip and an output signal of the analog signal modulator, and
   performing, by the digital signal modulator, digital signal modulation to the output signal of the analog signal modulator, and outputting a modulated signal by a digital interface.

7. The method according to claim 6, further comprising:
   supplying power, by a power supply circuit comprising a filter and a voltage stabilizer connected to each other, to the MEMS chip, the analog signal modulator, and the digital signal modulator.

8. The circuit according to claim 6, wherein the analog signal modulator uses an input signal of the MEMS chip and an output signal of the digital signal modulator as feedback signals to perform differentiate operation to construct a closed loop.

9. The method according to claim 8, wherein the analog signal modulator is a Δ-Σ modulator.

10. The method according to claim 8, wherein the digital signal modulator is a Δ-Σ digital modulator.

* * * * *